United States Patent
Nakabayashi

(10) Patent No.: US 11,561,338 B2
(45) Date of Patent: Jan. 24, 2023

(54) LIGHT-EMITTING MODULE

(71) Applicant: NICHIA CORPORATION, Anan (JP)

(72) Inventor: Takuya Nakabayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 189 days.

(21) Appl. No.: 17/039,946

(22) Filed: Sep. 30, 2020

(65) Prior Publication Data

US 2021/0096292 A1    Apr. 1, 2021

(30) Foreign Application Priority Data

Sep. 30, 2019 (JP) .............................. JP2019-180582
Dec. 26, 2019 (JP) .............................. JP2019-237146

(51) Int. Cl.
*F21V 8/00* (2006.01)
*H01L 33/60* (2010.01)
*H01L 33/54* (2010.01)

(52) U.S. Cl.
CPC .......... *G02B 6/0055* (2013.01); *G02B 6/0021* (2013.01); *G02B 6/0051* (2013.01); *G02B 6/0065* (2013.01); *H01L 33/60* (2013.01); *G02B 6/0068* (2013.01); *H01L 33/54* (2013.01)

(58) Field of Classification Search
CPC .... G02B 6/055; G02B 6/0021; G02B 6/0051; G02B 6/0065; G02B 6/0068; H01L 33/60; H01L 33/54
See application file for complete search history.

(56) References Cited

U.S. PATENT DOCUMENTS

| | | |
|---|---|---|
| 5,576,578 A | 11/1996 | Fuhrer et al. |
| 5,703,894 A | 12/1997 | Valster et al. |
| 5,859,496 A | 1/1999 | Murazaki et al. |
| 5,998,925 A | 12/1999 | Shimizu et al. |
| 6,106,093 A | 8/2000 | Nagoshi et al. |
| 6,163,072 A | 12/2000 | Tatoh |
| 6,924,596 B2 | 8/2005 | Sato et al. |
| 2001/0001207 A1 | 5/2001 | Shimizu et al. |
| 2004/0051111 A1 | 3/2004 | Ota et al. |
| 2004/0159836 A1 | 8/2004 | Sugimoto et al. |
| 2005/0265029 A1* | 12/2005 | Epstein ............... G09F 9/33 362/241 |

(Continued)

FOREIGN PATENT DOCUMENTS

| | | |
|---|---|---|
| CN | 1148729 A | 4/1997 |
| CN | 2717023 Y | 8/2005 |

(Continued)

*Primary Examiner* — Mary Ellen Bowman
(74) *Attorney, Agent, or Firm* — Hunton Andrews Kurth LLP

(57) ABSTRACT

A light-emitting module includes a light guide plate including a first surface, and a second surface opposite to the first surface; a light-emitting device disposed at a second surface side of the light guide plate; a first light-reflective member provided at a periphery of the light-emitting device at the second surface side; and a second light-reflective member provided outward of the first light-reflective member at the second surface. A diffuse reflectance of the first light-reflective member for light emitted by the light-emitting device is greater than a diffuse reflectance of the second light-reflective member for the light emitted by the light-emitting device.

17 Claims, 17 Drawing Sheets

(56) References Cited

U.S. PATENT DOCUMENTS

| | | | |
|---|---|---|---|
| 2006/0002146 A1* | 1/2006 | Baba | G02F 1/133603 |
| | | | 362/613 |
| 2007/0138494 A1 | 6/2007 | Pugh et al. | |
| 2007/0243994 A1 | 10/2007 | Sakamoto | |
| 2007/0246841 A1 | 10/2007 | Yamamoto et al. | |
| 2009/0129058 A1 | 5/2009 | Tokita et al. | |
| 2010/0207152 A1* | 8/2010 | Won | H01L 33/62 |
| | | | 257/E33.056 |
| 2011/0051457 A1* | 3/2011 | Chen | F21S 8/04 |
| | | | 362/606 |
| 2011/0175127 A1 | 7/2011 | Kanada et al. | |
| 2012/0013811 A1* | 1/2012 | Shimizu | G02B 6/0055 |
| | | | 348/739 |
| 2014/0197528 A1 | 7/2014 | Nagata | |
| 2015/0287261 A1 | 10/2015 | Pinchen et al. | |
| 2016/0035943 A1 | 2/2016 | Kao | |
| 2019/0006568 A1 | 1/2019 | Hayashi | |

FOREIGN PATENT DOCUMENTS

| | | |
|---|---|---|
| CN | 1240144 C | 2/2006 |
| CN | 101045639 A | 10/2007 |
| CN | 101060103 A | 10/2007 |
| CN | 100382349 C | 4/2008 |
| CN | 201820793 U | 5/2011 |
| CN | 107505769 A | 12/2017 |
| EP | 622858 A1 | 11/1994 |
| EP | 952617 A1 | 10/1999 |
| EP | 1352431 A1 | 10/2003 |
| JP | S63000851 A | 1/1988 |
| JP | S63001747 A | 1/1988 |
| JP | S63017250 A | 1/1988 |
| JP | S63124483 A | 5/1988 |
| JP | H08000220 A | 1/1996 |
| JP | H08000653 A | 1/1996 |
| JP | H08001962 A | 1/1996 |
| JP | H08050003 A | 2/1996 |
| JP | H09506478 A | 6/1997 |
| JP | H11040689 A | 2/1999 |
| JP | 2606869 Y2 | 1/2001 |
| JP | 2001035228 A | 2/2001 |
| JP | 2006236771 A | 9/2006 |
| JP | 2007180021 A | 7/2007 |
| JP | 3202091 U | 1/2016 |
| JP | 5838309 B2 | 1/2016 |
| JP | 2016006033 A | 1/2016 |
| JP | 2016500181 A | 1/2016 |
| JP | 2019009429 A | 1/2019 |
| KR | 20090117419 A | 11/2009 |
| WO | 10013396 A1 | 2/2010 |
| WO | 2010113361 A1 | 10/2010 |
| WO | 13027669 A1 | 2/2013 |
| WO | 2013128761 A1 | 9/2013 |
| WO | 2016002883 A1 | 1/2016 |

* cited by examiner

LIGHT-EMITTING MODULE

CROSS-REFERENCE TO RELATED APPLICATIONS

This application claims priority to Japanese Patent Application No. 2019-180582, filed on Sep. 30, 2019, and Japanese Patent Application No. 2019-237146, filed on Dec. 26, 2019, the disclosures of Japanese Patent Application Nos. 2019-180582 and 2019-237146 are hereby incorporated by reference in their entireties.

BACKGROUND

The present disclosure relates to a light-emitting module.

A light-emitting module in which a light guide plate is combined with a light-emitting element such as a light-emitting diode or the like is widely utilized as a surface light source such as, for example, the backlight of a liquid crystal display or the like. For example, in a direct-type backlight in which light-emitting element is disposed directly under a light guide plate, the luminance at the light-emitting element vicinity easily increases locally. Therefore, for example, International Publication No. 2010/113361 discusses a backlight in which a reflective sheet is provided at the surface of the light guide plate on the side opposite to the light-emitting surface, and a light-scattering structure is provided in the light incident surface of the light guide plate facing the light-emitting element.

Further countermeasures are necessary when, for example, uneven luminance occurs more easily in the light-emitting surface of the light guide plate due to thinner light guide plates used in thinner liquid crystal displays and due to the development of light-emitting elements having higher luminance.

SUMMARY

A light-emitting module according to an embodiment of the present disclosure can reduce uneven luminance in the light-emitting surface.

In an embodiment of the present disclosure, a light-emitting module includes a light guide plate including a first surface, and a second surface at a side opposite to the first surface; a light-emitting device disposed at a second surface side of the light guide plate; a first light-reflective member provided at a periphery of the light-emitting device at the second surface side; and a second light-reflective member provided outward of the first light-reflective member at the second surface. A diffuse reflectance of the first light-reflective member for light emitted by the light-emitting device is greater than a diffuse reflectance of the second light-reflective member for the light emitted by the light-emitting device.

According to the present disclosure, a light-emitting module can reduce uneven luminance in the light-emitting surface.

DETAILED DESCRIPTION OF EMBODIMENTS

Figure 1:
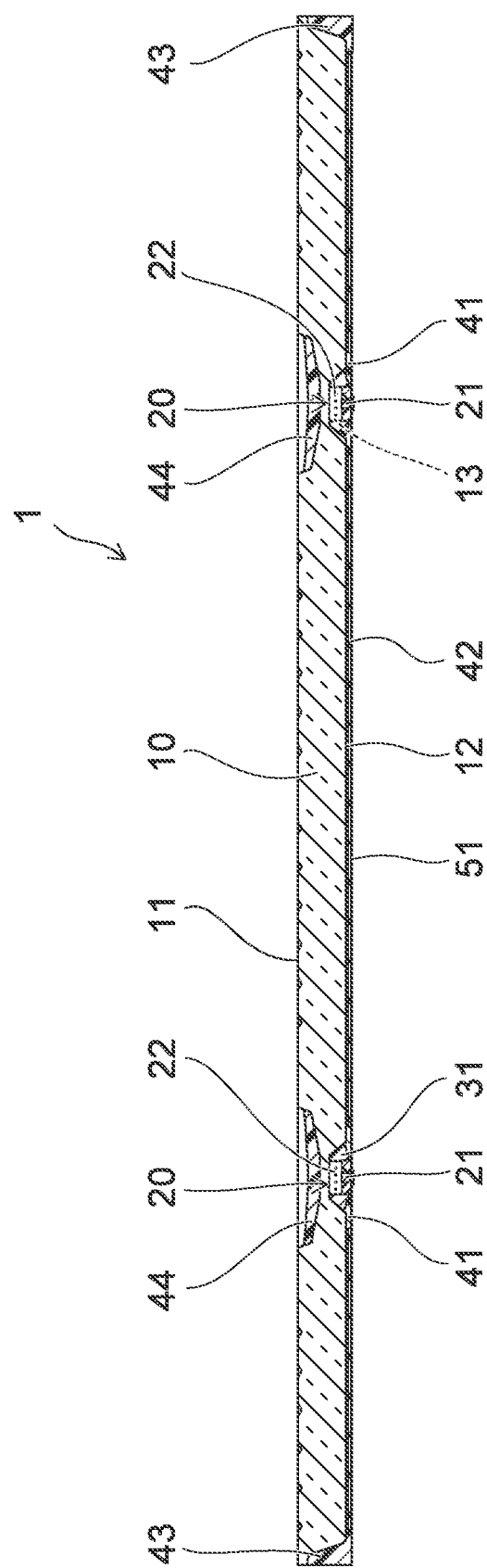
FIG. 1 is a schematic cross-sectional view of a light-emitting module of an embodiment of the present disclosure.

Embodiments will now be described with reference to the drawings. The same components in the drawings are marked with the same reference numerals.

FIG. 1 is a schematic cross-sectional view of a light-emitting module 1 of an embodiment of the present disclosure.

Figure 2:
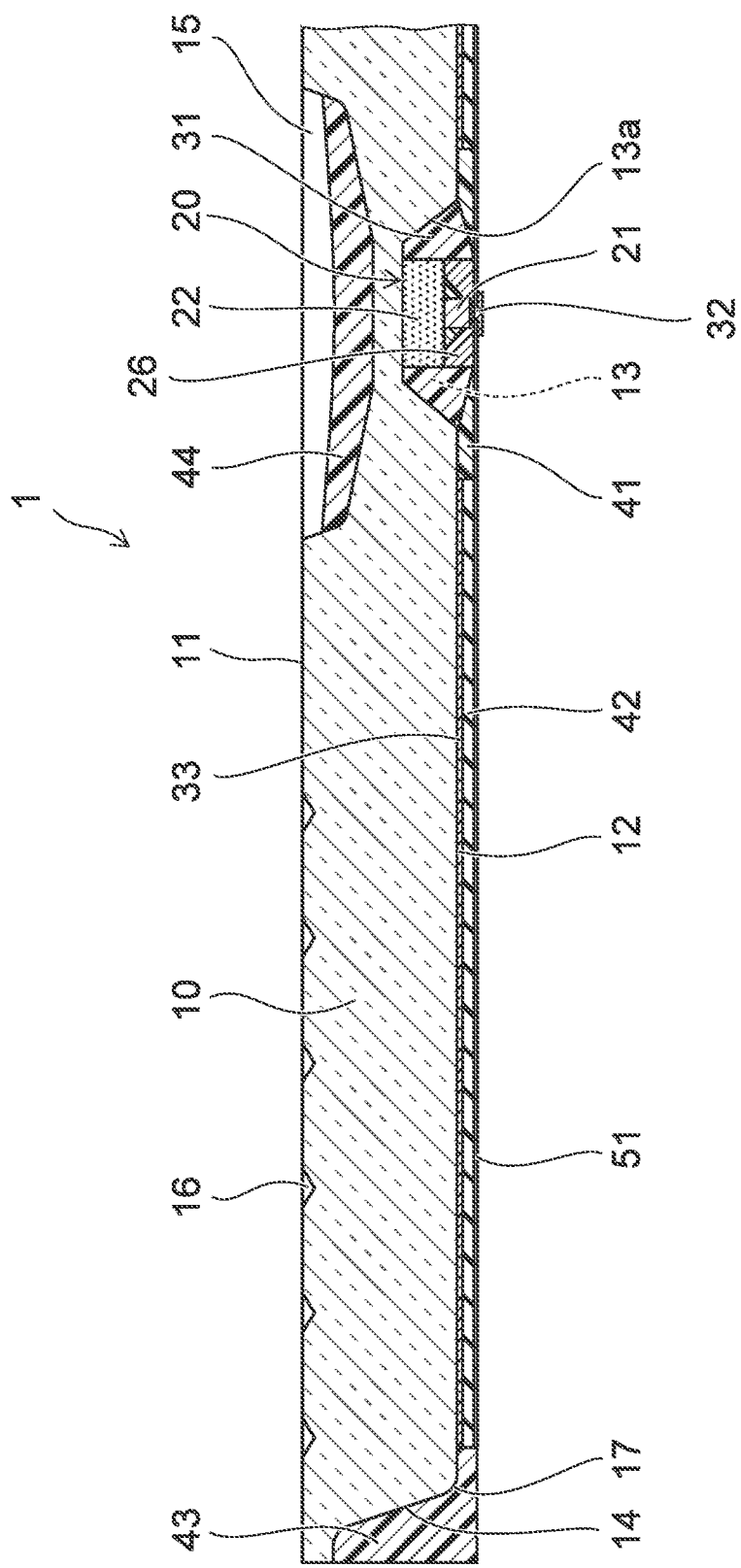
FIG. 2 is an enlarged cross-sectional view of a portion of the light-emitting module shown in FIG. 1.

FIG. 2 is an enlarged cross-sectional view of a portion of the light-emitting module 1 shown in FIG. 1.

The light-emitting module 1 includes a light guide plate 10, a light-emitting device 20, a first light-reflective member 41, a second light-reflective member 42, a third light-reflective member 43, and a fourth light-reflective member 44.

The light-emitting device 20 includes a light-emitting element 21 and a transparent member 22. The transparent member 22 includes, for example, a fluorescer. The light guide plate 10 is transmissive to the light emitted by the light-emitting device 20. In the specification, the light emitted by the light-emitting device 20 refers to the light emitted by the light-emitting element 21 and the light emitted by a fluorescer included in the transparent member 22. When the light-emitting device 20 does not include a fluorescer, the light emitted by the light-emitting device 20 refers to the light emitted by the light-emitting element 21. When the transparent member 22 of the light-emitting device 20 does not include a fluorescer, a fluorescer sheet may be provided on a first surface 11 of the light guide plate 10. The light-emitting device 20 may include only the light-emitting element 21.

For example, a thermoplastic resin such as acrylic, polycarbonate, cyclic polyolefin, polyethylene terephthalate, polyester, or the like, a thermosetting resin such as epoxy, silicone, or the like, glass, etc., may be used as the material of the light guide plate 10.

The light guide plate 10 includes the first surface 11, which is the light-emitting surface of the light-emitting module 1, and a second surface 12 opposite to the first surface 11. The light guide plate 10 also has a recess 13 at the second surface 12 side. The light-emitting device 20 is disposed in the recess 13. It is favorable for the thickness of the light guide plate 10 to be not less than 200 μm and not more than 800 μm. In the thickness direction of the light guide plate 10, the light guide plate 10 may include a single layer, or may include a stacked body of multiple layers. When the light guide plate 10 includes a stacked body, a transparent bonding layer may be provided between the layers. The layers of the stacked body may include different types of major materials.

Figure 3A:
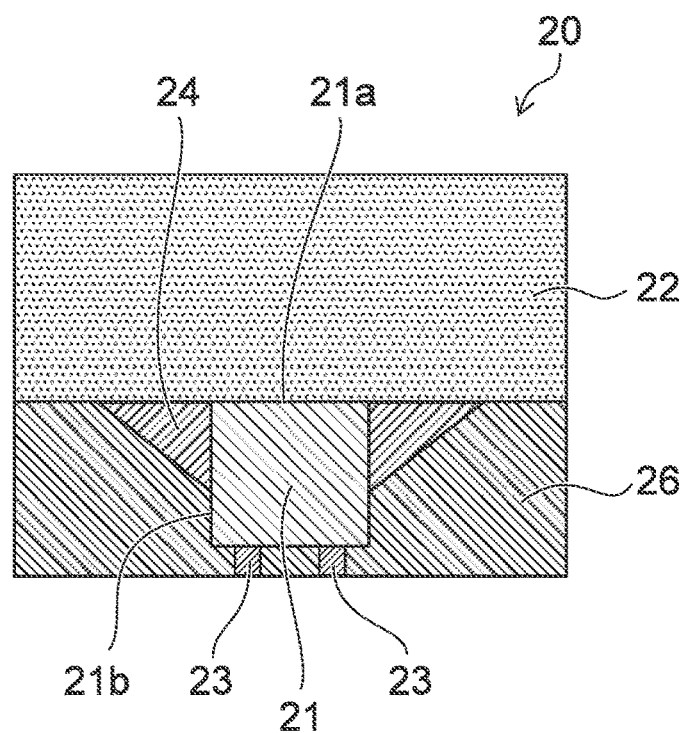
FIG. 3A is a schematic cross-sectional view of a light-emitting device of the light-emitting module of an embodiment of the present disclosure.

FIG. 3A is a schematic cross-sectional view of the light-emitting device 20.

The light-emitting device 20 includes the light-emitting element 21. The light-emitting element 21 may have a semiconductor stacked structure. As the semiconductor stacked structure, for example, the light-emitting element 21 includes $In_xAl_yGa_{1-x-y}N$ (0≤x, 0≤y, and x+y≤1) and can emit blue light. The light-emitting element 21 may include an element emitting light other than blue. Also, light-emitting elements 21 that emit light of different colors may be used as the light-emitting elements 21 included in multiple light-emitting devices 20.

The transparent member 22 is provided on a major light-emitting surface 21a of the light-emitting element 21. The light-emitting element 21 is bonded to the transparent member 22 by a transparent bonding member 24. The transparent member 22 covers the major light-emitting surface 21a of the light-emitting element 21 and spreads into a region that is further outward than a side surface 21b of the light-emitting element 21.

For example, a silicone resin, an epoxy resin, glass, etc., may be used as the material of the transparent member 22. For example, the transparent member 22 is a fluorescer layer, and a fluorescer is dispersed in the transparent member 22. The fluorescer is excited by the light emitted by the light-emitting element 21 and emits light of a wavelength different from the wavelength of the light emitted by the light-emitting element 21. For example, a fluoride-based fluorescer such as a YAG fluorescer, a β-sialon fluorescer, a KSF-based fluorescer, a MGF-based fluorescer, or the like, a nitride fluorescer such as a CASN-based fluorescer, etc., may be used as the fluorescer. The transparent member 22 may include multiple types of fluorescers. Also, multiple layers of the fluorescers recited above may be stacked.

Figure 3B:
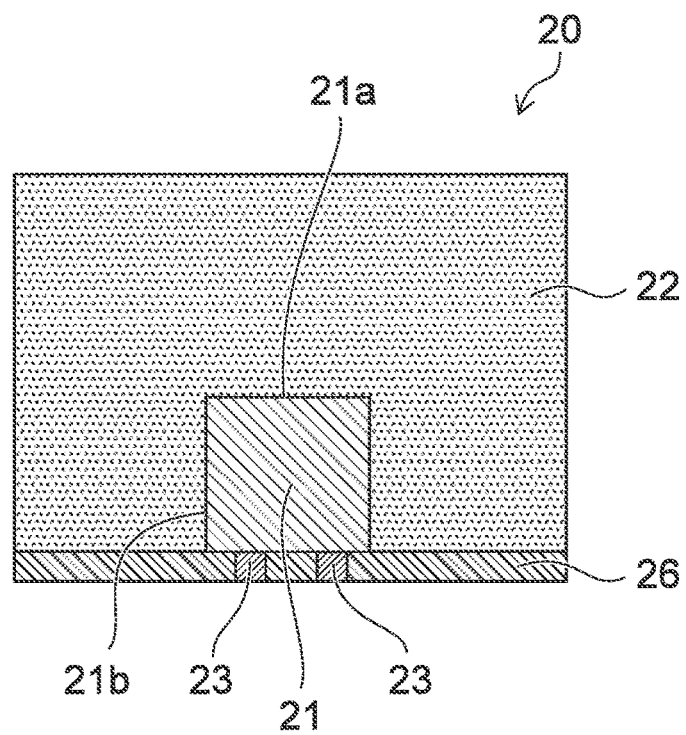
FIG. 3B is a schematic cross-sectional view of a light-emitting device of the light-emitting module of an embodiment of the present disclosure.

Or, as shown in FIG. 3B, the fluorescer-including transparent member 22 of the light-emitting device 20 may cover the major light-emitting surface (the upper surface) 21a and the side surface 21b of the light-emitting element 21.

A pair of positive and negative electrodes 23 is provided at the side opposite to the major light-emitting surface 21a of the light-emitting element 21. The side surface 21b of the light-emitting element 21 is covered with a sixth light-reflective member 26. The sixth light-reflective member 26 is provided also at the lower surface of the light-emitting element 21 so that the surfaces (in FIGS. 3A and 3B, the lower surfaces) of the pair of electrodes 23 at the lower surface of the light-emitting element 21 are exposed. The sixth light-reflective member 26 may cover the side surface 21b of the light-emitting element 21 and the side surface of the transparent member 22.

As shown in FIG. 2, the light-emitting element 21 is positioned more proximate to the second surface 12 than the transparent member 22, and the transparent member 22 is positioned more proximate to the first surface 11 than the light-emitting element 21.

A light-transmissive member 31 is provided between a sidewall 13a of the recess 13 in which the light-emitting device 20 is disposed and the side surface of the light-emitting device 20 (the side surface of the transparent member 22 and the side surface of the sixth light-reflective member 26). The light-emitting device 20 is fixed to the light guide plate 10 by the light-transmissive member 31. Multiple light-emitting devices 20 are fixed to one light guide plate 10. Or, a configuration may be used in which one light-emitting device 20 is fixed to one light guide plate 10.

The light-transmissive member 31 is transmissive to the light emitted by the light-emitting device 20 and may include, for example, the same resin as the material of the light guide plate 10 or a resin having a small refractive index difference with the material of the light guide plate 10. Or, glass may be used as the material of the light-transmissive member 31.

Preferably, a space such as an air layer or the like is not formed between the light-transmissive member 31 and the side surface of the light-emitting device 20 or between the light-transmissive member 31 and the sidewall 13a of the recess 13. Because an air layer is not interposed between the light guide plate 10 and the side surface of the transparent member 22 of the light-emitting device 20, compared to when an air layer is interposed, the refractive index difference between the transparent member 22 and the light guide plate 10 can be smaller, and the input efficiency of the light from the transparent member 22 to the light guide plate 10 can be increased.

A recess 15 is formed at the first surface 11 side in a portion of the light guide plate 10 facing the light-emitting device 20; and the fourth light-reflective member 44 is provided in the recess 15. The size of the recess 15 when viewed in plan is greater than the size, when viewed in plan, of the recess 13 at the second surface 12 side where the light-emitting device 20 is disposed.

The first light-reflective member 41 is provided at the periphery of the light-emitting device 20 at the second surface 12 side of the light guide plate 10. The first light-reflective member 41 is provided below the light-transmissive member 31 and at the side surface of the sixth light-reflective member 26 but is not provided at the side surface of the transparent member 22 including the fluorescer. The side surface of the transparent member 22 is covered with the light-transmissive member 31. The first light-reflective member 41 is provided at the second surface 12 at the periphery of the recess 13.

The second light-reflective member 42 is provided outward of the first light-reflective member 41 at the second surface 12 of the light guide plate 10. The second light-reflective member 42 is adhered to the second surface 12 by a bonding layer 33. The bonding layer 33 is, for example, a resin layer that is transmissive to the light emitted by the light-emitting device 20.

The light guide plate 10 may include a side surface 14 tilted with respect to the first and second surfaces 11 and 12. For example, the side surface 14 and the second surface 12 are continuous and form an obtuse angle. The third light-reflective member 43 is provided at the side surface 14. The third light-reflective member 43 is provided also at a portion of the second surface 12 to cover the corner between the side surface 14 and the second surface 12.

The second light-reflective member 42 is provided between the first light-reflective member 41 and the third light-reflective member 43 provided at the portion of the second surface 12. Also, as shown in FIG. 1, the second light-reflective member 42 is provided at the second surface 12 between the first light-reflective members 41 between the multiple light-emitting devices 20. The boundary between the first light-reflective member 41 and the second light-reflective member 42 is at a position overlapping the fourth light-reflective member 44 in the thickness direction of the light guide plate 10. It is favorable for the thickness of the second light-reflective member 42 to be not less than 35 μm and not more than 350 μm.

As shown in FIG. 2, wiring 51 is provided at the lower surface of the second light-reflective member 42, the lower surface of the first light-reflective member 41, and the lower surface of the sixth light-reflective member 26. The wiring 51 is connected to the electrodes 23 of the light-emitting element 21. Separate wiring 51 is provided for the pair of electrodes 23.

Figure 4:
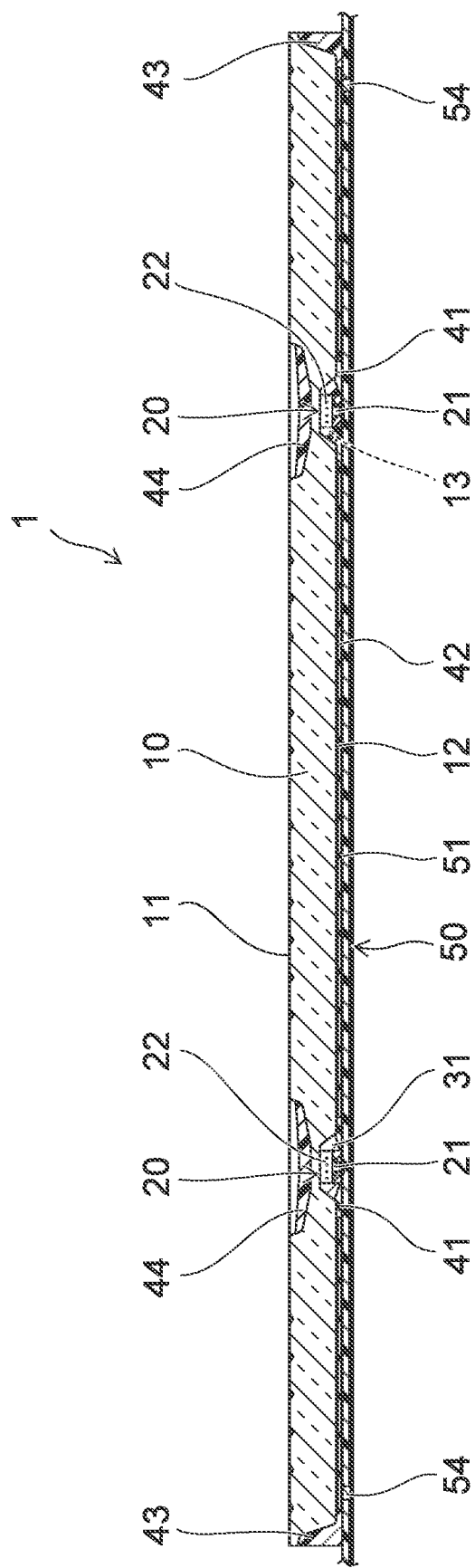
FIG. 4 is a schematic cross-sectional view showing a state in which the light-emitting module shown in FIG. 1 is connected to a wiring board.
Figure 5:
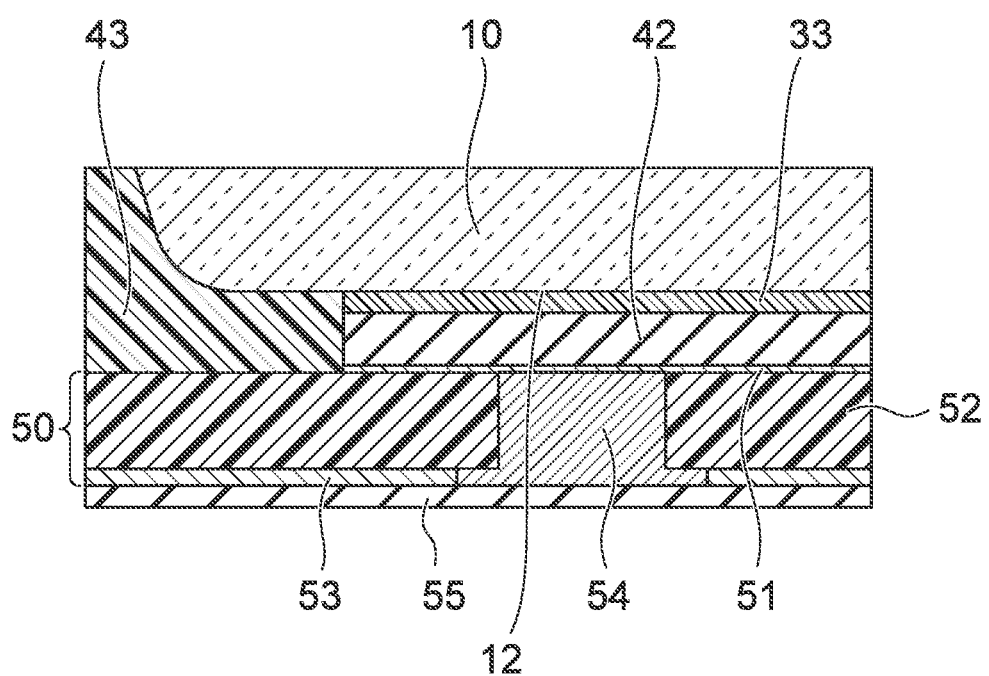
FIG. 5 is an enlarged cross-sectional view of a portion of the light-emitting module shown in FIG. 4.

FIG. 4 shows a state in which the light-emitting module 1 is connected to a wiring board 50. FIG. 5 is an enlarged cross-sectional view of a portion of the light-emitting module 1 shown in FIG. 4. The wiring board 50 is bonded to the wiring 51. The wiring board 50 is, for example, a flexible wiring board. As shown in FIG. 5, the wiring board 50 includes a base 52, wiring 53, and a conductive via 54. The insulative base 52 is provided between the wiring 51 and the wiring 53. The base 52 is adhered also to the lower surface of the third light-reflective member 43.

The conductive via 54 extends through the base 52 and connects the wiring 51 and the wiring 53. An insulating film 55 is provided at the surface of the wiring 53.

As shown in FIGS. 1 and 2, a recess 16 is formed in a region of the first surface 11 of the light guide plate 10 facing the second light-reflective member 42. Or, a protrusion may be formed in the first surface 11 of the light guide plate 10. For example, the recess 16 (or the protrusion) is formed in a concentric circular configuration at the periphery of the recess 15 facing the light-emitting device 20. Or, the recess 16 (or the protrusion) may be formed in a dot configuration. The recess 16 (or the protrusion) functions as a prism that refracts and/or reflects the light.

The first light-reflective member 41, the third light-reflective member 43, the fourth light-reflective member 44, and the sixth light-reflective member 26 may comprise or be, for example, white resin members including light-diffusing materials. The first light-reflective member 41, the third light-reflective member 43, the fourth light-reflective member 44, and the sixth light-reflective member 26 may comprise or be, for example, members of a silicone resin or an epoxy resin including titanium oxide as the light-diffusing material.

The second light-reflective member 42 includes, for example, a stacked film of multiple insulating films. For example, a polyester resin can be used as the insulating film. In certain embodiments, the second light-reflective member 42 does not include a light-diffusing material. Or, the content ratio (weight percent) of the light-diffusing material in the second light-reflective member 42 is less than the content ratios (weight percent) of the light-diffusing materials in the first light-reflective member 41, the third light-reflective member 43, the fourth light-reflective member 44, and the sixth light-reflective member 26. The second light-reflective member 42 may comprise or be white polyethylene terephthalate including titanium oxide as a light-diffusing material, or white polyethylene terephthalate in which many voids are formed.

The diffuse reflectances for the light emitted by the light-emitting device 20 of the first light-reflective member 41, the third light-reflective member 43, the fourth light-reflective member 44, and the sixth light-reflective member 26 are greater than the diffuse reflectance for the light emitted by the light-emitting device 20 of the second light-reflective member 42. For example, the diffuse reflectance can be measured with a high-speed spectrocolorimeter (CMS-35SP) made by Murakami Color Research Laboratory Co., Ltd.

For the first light-reflective member 41, the third light-reflective member 43, the fourth light-reflective member 44, and the sixth light-reflective member 26, the diffuse reflectances are greater than the specular reflectances for the light emitted by the light-emitting device 20. For the second light-reflective member 42, the diffuse reflectance is less than the specular reflectance for the light emitted by the light-emitting device 20.

The content ratio of the light-diffusing material in the fourth light-reflective member 44 may be less than the content ratios of the light-diffusing materials in the first light-reflective member 41, the third light-reflective member 43, and the sixth light-reflective member 26. Therefore, the transmittance of the fourth light-reflective member 44 for the light emitted by the light-emitting device 20 is greater than the transmittances of the first light-reflective member 41, the third light-reflective member 43, and the sixth light-reflective member 26 for the light emitted by the light-emitting device 20.

The light that is emitted upward at the light-emitting device 20 is moderately diffused downward and laterally by the fourth light-reflective member 44 while being transmitted by the fourth light-reflective member 44. In other words, the fourth light-reflective member 44 causes the region directly above the light-emitting device 20 at the light-emitting surface (the first surface 11) of the light-emitting module 1 to be not too dark and not too bright.

The light that is emitted from the light-emitting device 20 toward the second surface 12 side is diffusely reflected upward by the first light-reflective member 41, and the luminance of the light extracted from the first surface 11, which is the light-emitting surface, can be increased.

The sixth light-reflective member 26 that is provided at the side surface of the light-emitting element 21 suppresses the light entering the light guide plate 10 from the light-emitting element 21 without passing through the fluorescer-including transparent member 22.

The first light-reflective member 41 and the sixth light-reflective member 26 can suppress the exposure to the light of the light-emitting element 21 of the base 52 of the wiring board 50 at the vicinity of the light-emitting device 20 and prevent the degradation of the base 52.

A portion of the light that is diffusely reflected by the first light-reflective member 41 and/or the fourth light-reflective member 44 travels toward the second light-reflective member 42 and/or the first surface 11. The light from the light-emitting device 20 is guided through the light guide plate 10 toward the side surface 14 of the light guide plate 10 while repeating total internal reflections at the first surface 11 and specular reflections at the second light-reflective member 42 in the region between the second light-reflective member 42 and the first surface 11. A portion of the light that travels toward the first surface 11 is extracted outside the light guide plate 10 from the first surface 11.

The light can be easily guided to the end (the side surface 14) of the light guide plate 10 by using, as the second light-reflective member 42, a substance having higher specular reflection characteristics than diffuse reflection characteristics for the light emitted by the light-emitting device 20. The light is easily guided to the entire region of the light guide plate 10 even when the distance between the light-emitting device 20 and the side surface 14 of the light guide plate 10 and/or the distance between the multiple light-emitting devices 20 are long. The uneven luminance in the light-emitting surface (the first surface 11) can be reduced thereby. Also, the number of the light-emitting devices 20 disposed in the light guide plate 10 may be reduced.

The luminance of the light extracted from the first surface 11 at the region proximate to the end of the light guide plate 10 can be increased because the light that is guided to the side surface 14 of the light guide plate 10 can be diffusely reflected toward the first surface 11 by the third light-reflective member 43 provided at the side surface 14.

Also, the third light-reflective member 43 suppresses the light guided between the adjacent light-emitting modules 1 in a configuration in which multiple light-emitting modules 1 are arranged to be adjacent to each other to realize a surface light source having a wider light-emitting surface. For example, the light that is guided from a light-emitting module 1 in a light-emitting state to a light-emitting module 1 in a non-light-emitting state is limited.

A method for manufacturing the light-emitting module 1 of the embodiment will now be described with reference to FIGS. 6 to 14.

Figure 6:
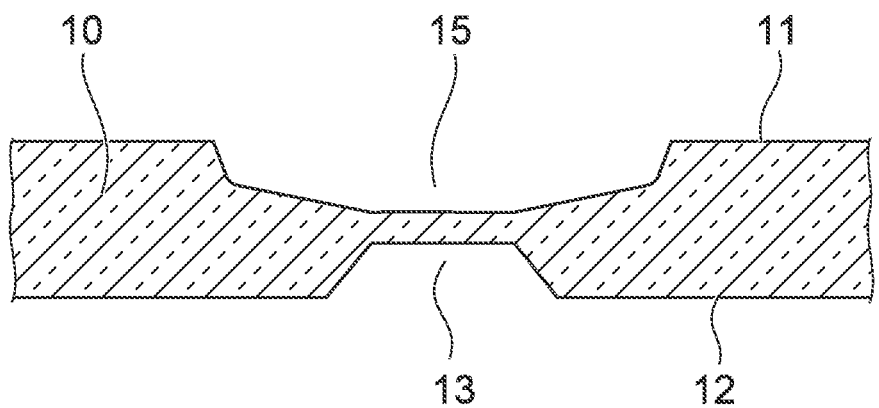
FIG. 6 to FIG. 13 are schematic cross-sectional views showing a method for manufacturing the light-emitting module shown in FIG. 1.

The light guide plate 10 is prepared as shown in FIG. 6. The recess 15 is formed in the first surface 11 side of the light guide plate 10, and the recess 13 is formed in the second surface 12 side.

Figure 7:
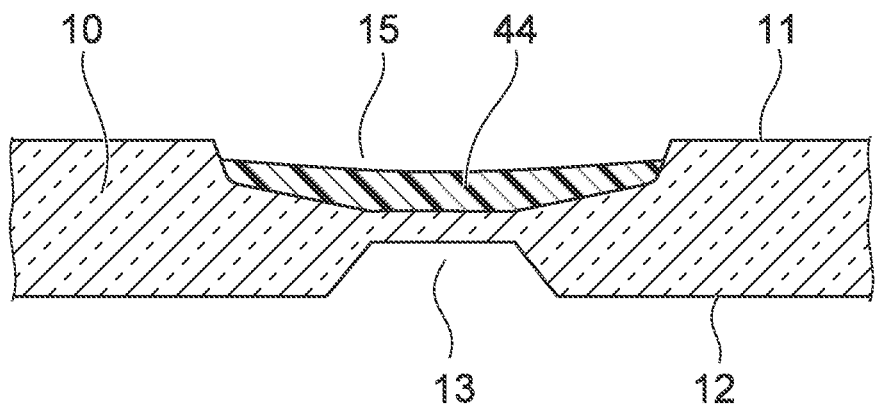

As shown in FIG. 7, the fourth light-reflective member 44 is formed in the recess 15.

Figure 8:
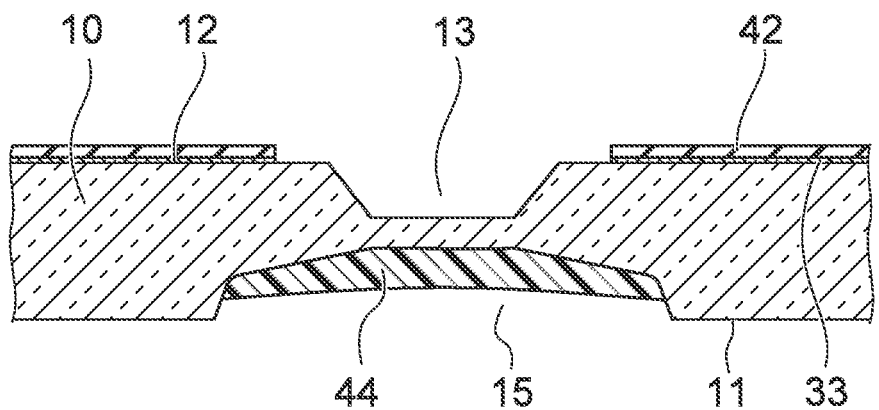

After the fourth light-reflective member 44 is formed, the sheet-like second light-reflective member 42 is adhered to the second surface 12 by the bonding layer 33 as shown in FIG. 8.

Figure 9:
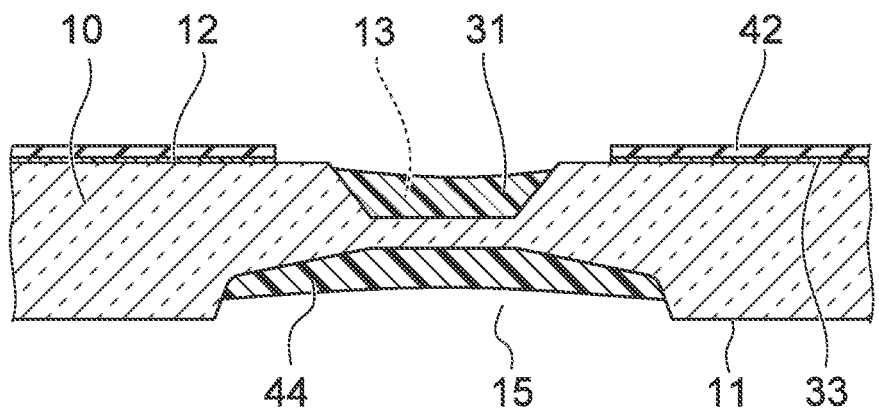

After the second light-reflective member 42 is adhered to the second surface 12, the light-transmissive member 31 is supplied to the recess 13 as shown in FIG. 9. The light-transmissive member 31 is, for example, a liquid resin.

Figure 10:
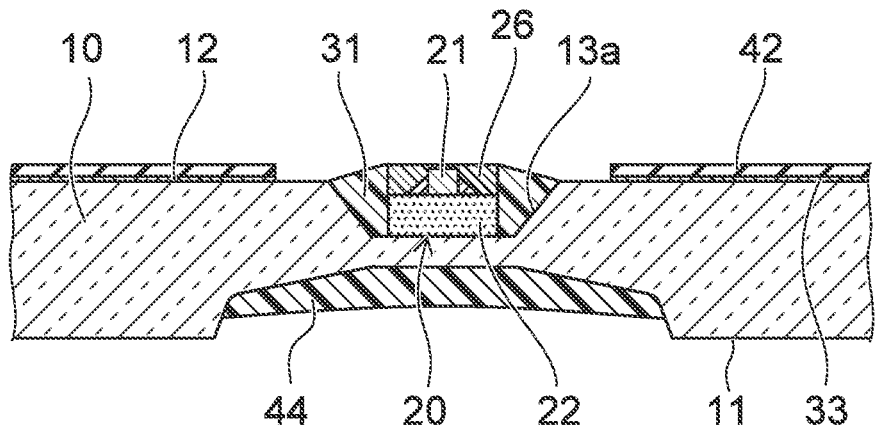

As shown in FIG. 10, the light-emitting device 20 is disposed in the recess 13 to which the light-transmissive member 31 is supplied. The transparent member 22 of the light-emitting device 20 is placed at the bottom surface of the recess 13. Subsequently, the liquid light-transmissive member 31 is cured, and the light-emitting device 20 is fixed to the light guide plate 10 by the light-transmissive member 31.

Figure 11:
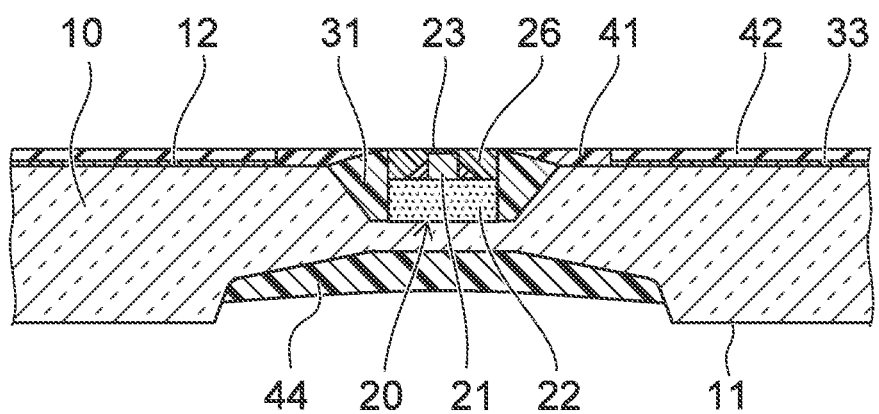

After the light-emitting device 20 is fixed to the light guide plate 10, the first light-reflective member 41 is formed at the periphery of the light-emitting device 20 at the second surface 12 as shown in FIG. 11. The first light-reflective member 41 is formed to cover the light-transmissive member 31 at the region of the second surface 12 between the second light-reflective member 42 and the sixth light-reflective member 26 of the light-emitting device 20.

The third light-reflective member 43 also is formed at the side surface 14 of the light guide plate 10 shown in FIG. 2 when forming the second light-reflective member 42.

Figure 12:
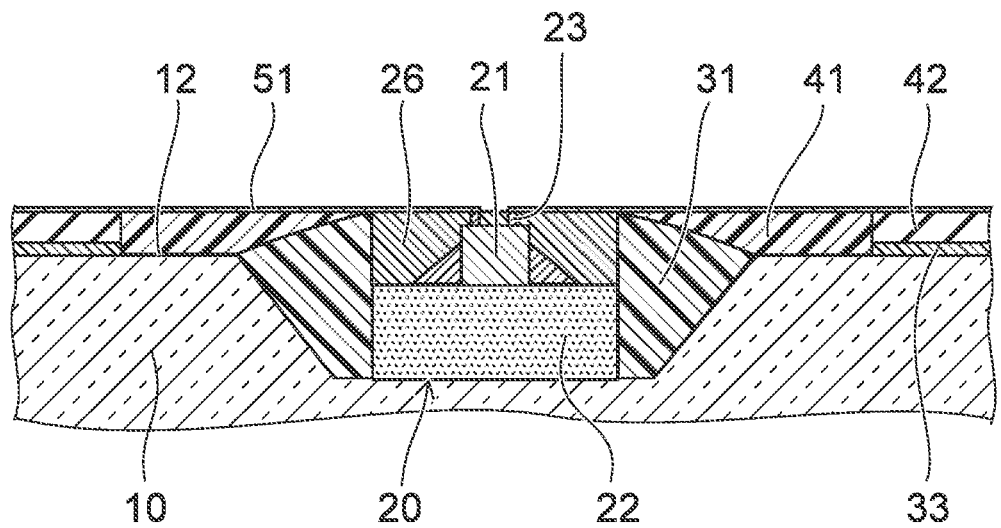

As shown in FIG. 12, the wiring 51 is formed on the second light-reflective member 42, on the first light-reflective member 41, and on the sixth light-reflective member 26 to be connected to the electrodes 23 of the light-emitting device 20.

Figure 13:
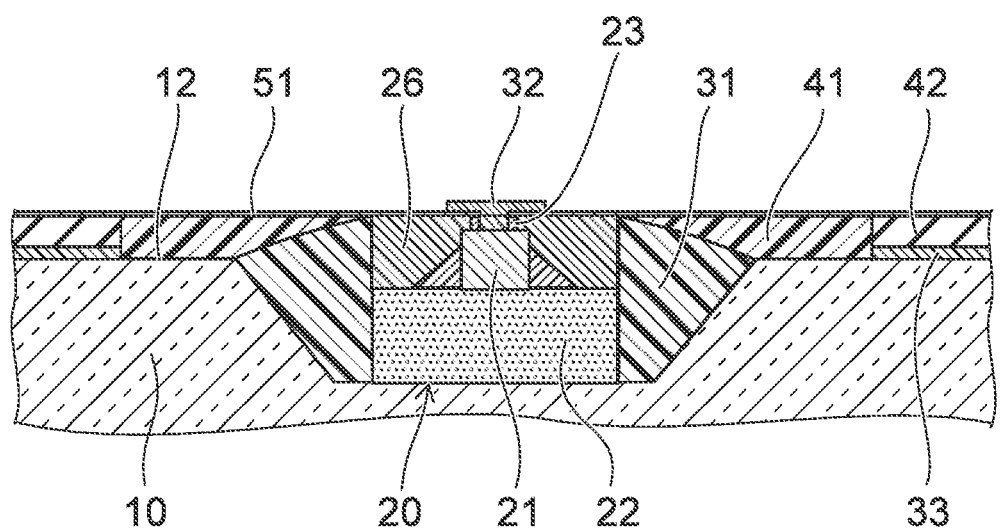

The wiring 51 is not formed on the sixth light-reflective member 26 between the pair of positive and negative electrodes 23. As shown in FIG. 13, an insulating film 32 is formed on the sixth light-reflective member 26 between the pair of electrodes 23 to increase the insulative properties between the pair of electrodes 23.

Figure 14:
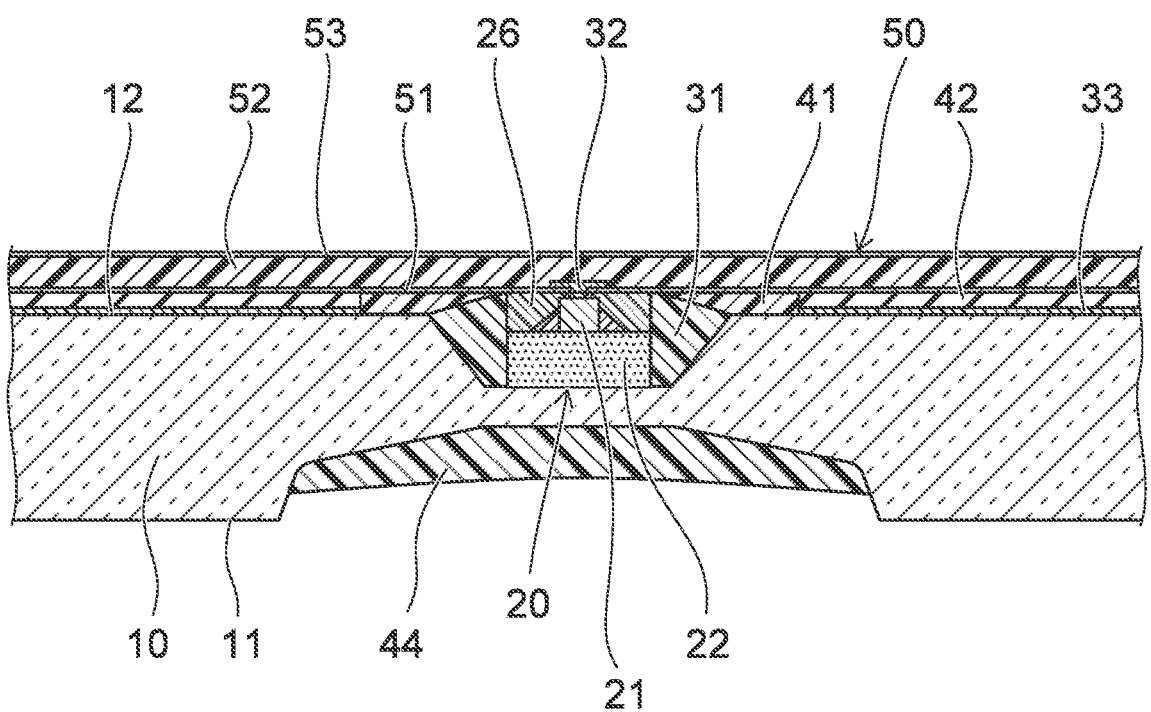
FIG. 14 is a schematic cross-sectional view showing a method for manufacturing the light-emitting module shown in FIG. 4.

As shown in FIG. 14, in the case where the light-emitting module 1 is connected to the wiring board 50, the base 52 of the wiring board 50 is adhered to the wiring 51. Subsequently, the conductive via 54 shown in FIG. 5 is formed, and the insulating film 55 that covers the conductive via 54 and the wiring 53 of the wiring board 50 is formed.

Here, as a comparative example, when the light-emitting devices 20 are disposed in the recesses 13 by bonding the light guide plate 10 in which the multiple recesses 13 are formed to a structure body in which the multiple light-emitting devices 20 are mounted beforehand to the wiring board 50, high precision is necessary between the mounting positions of the multiple light-emitting devices 20 on the wiring board 50 and the positions of the multiple recesses 13 in the light guide plate 10.

Conversely, according to the embodiment, the light-emitting devices 20 can be disposed with high positional precision with respect to the light guide plate 10 because the light guide plate 10 and the light-emitting devices 20 are configured as a continuous body and the light-emitting devices 20 are held by the light guide plate 10 and not by the wiring board 50. The unevenness of the luminance distribution in the light-emitting surface of the light guide plate 10 is suppressed thereby.

Figure 15:
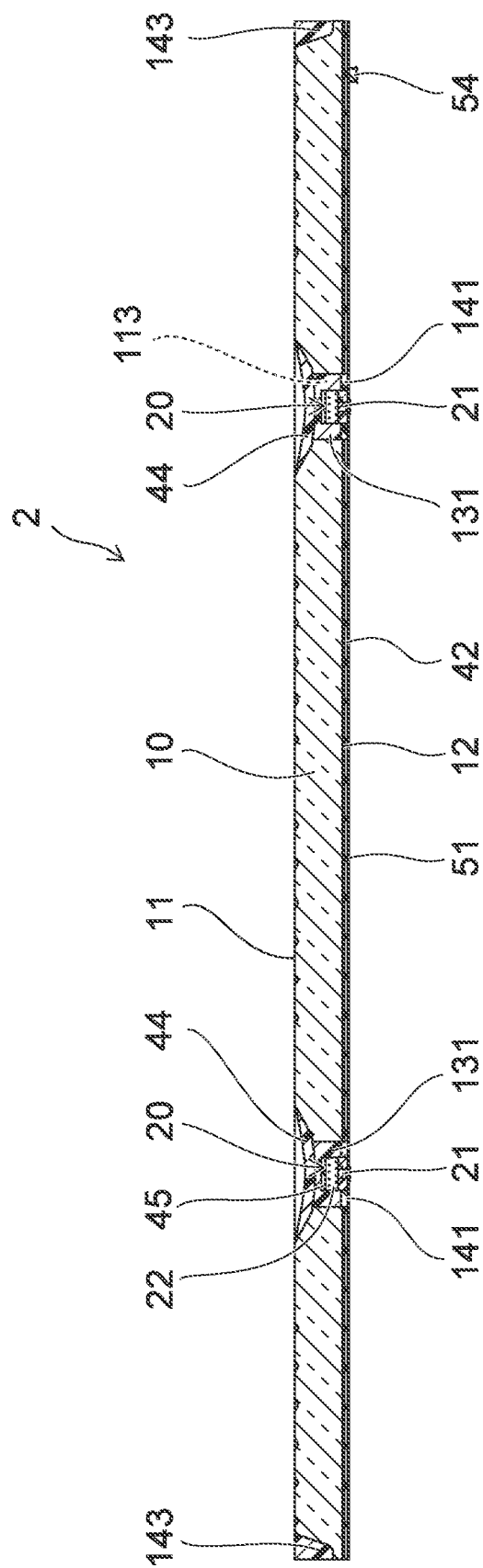
FIG. 15 is a schematic cross-sectional view of a light-emitting module of another embodiment of the present disclosure.

FIG. 15 is a schematic cross-sectional view of a light-emitting module 2 of another embodiment of the present disclosure.

Figure 16:
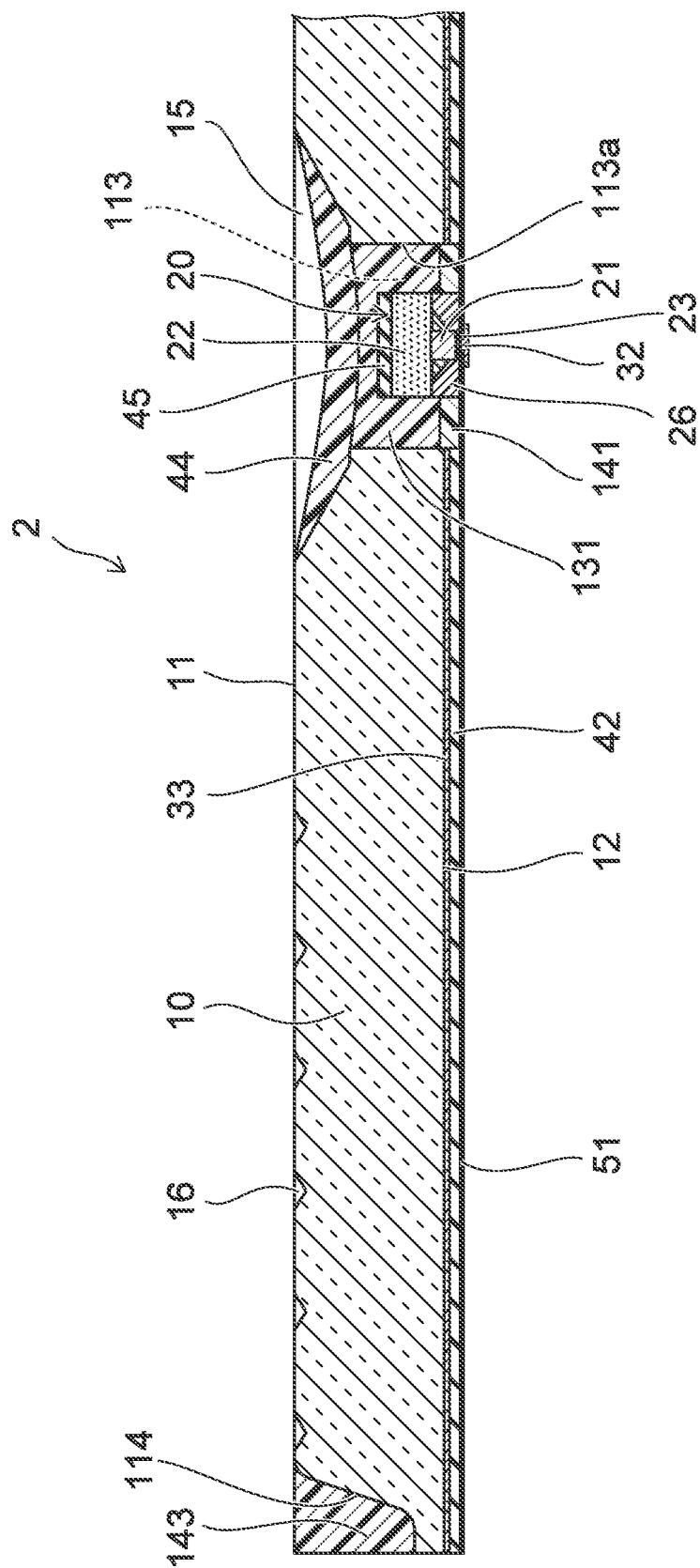
FIG. 16 is an enlarged cross-sectional view of a portion of the light-emitting module shown in FIG. 15.

FIG. 16 is an enlarged cross-sectional view of a portion of the light-emitting module 2 shown in FIG. 15.

The same components as the light-emitting module 1 of the embodiment described above are marked with the same reference numerals.

The light-emitting module 2 includes the light guide plate 10, the light-emitting device 20, a first light-reflective member 141, the second light-reflective member 42, a third light-reflective member 143, the fourth light-reflective member 44, and a fifth light-reflective member 45.

The light guide plate 10 includes a through-portion 113 extending between the first surface 11 and the second surface 12. The light-emitting device 20 is disposed in the through-portion 113. In the light-emitting device 20, the light-emitting element 21 is positioned more proximate to the second surface 12 than the transparent member 22, and the transparent member 22 is positioned more proximate to the first surface 11 than the light-emitting element 21.

A light-transmissive member 131 is provided between a sidewall 113a of the through-portion 113 and the side surface of the light-emitting device 20 (the side surface of the transparent member 22 and the side surface of the sixth light-reflective member 26). The light-emitting device 20 is fixed to the light guide plate 10 by the light-transmissive member 131.

The light-transmissive member 131 is transmissive to the light emitted by the light-emitting device 20 and may include, for example, the same resin as the material of the light guide plate 10 or a resin having a small refractive index difference with the material of the light guide plate 10. Or, glass may be used as the material of the light-transmissive member 131.

A space such as an air layer or the like is preferably not formed between the light-transmissive member 131 and the side surface of the light-emitting device 20 or between the light-transmissive member 131 and the sidewall 113a of the through-portion 113. Because an air layer is not interposed between the light guide plate 10 and the side surface of the transparent member 22 of the light-emitting device 20, compared to when an air layer is interposed, the refractive index difference between the transparent member 22 and the light guide plate 10 can be smaller, and the input efficiency of the light from the transparent member 22 to the light guide plate 10 can be increased.

The recess 15 is formed at the first surface 11 side at a portion of the light guide plate 10 facing the light-emitting device 20, and the fourth light-reflective member 44 is provided in the recess 15.

The fifth light-reflective member 45 is provided at the upper surface of the transparent member 22, which is the upper surface of the light-emitting device 20. The light-transmissive member 131 is provided also between the fifth light-reflective member 45 and the fourth light-reflective member 44 to cover the fifth light-reflective member 45.

The first light-reflective member 141 is provided at the periphery of the light-emitting device 20 at the second surface 12 side of the light guide plate 10. The first light-reflective member 141 is provided below the light-transmissive member 131 and at the side surface of the sixth light-reflective member 26 of the light-emitting device 20 but is not provided at the side surface of the fluorescer-including transparent member 22. The side surface of the transparent member 22 is covered with the light-transmissive member 131.

The second light-reflective member 42 is provided outward of the first light-reflective member 141 at the second surface 12 of the light guide plate 10. The second light-reflective member 42 is adhered to the second surface 12 by the bonding layer 33.

The second light-reflective member 42 extends to the end of the light guide plate 10. The second light-reflective member 42 is provided at the second surface 12 between the first light-reflective members 141 between the multiple light-emitting devices 20. The boundary between the first light-reflective member 141 and the second light-reflective member 42 is at a position overlapping the fourth light-reflective member 44 in the thickness direction of the light guide plate 10.

The light guide plate 10 includes a side surface 114 that is tilted with respect to the first and second surfaces 11 and 12. For example, the side surface 114 and the first surface 11 form an obtuse angle. The third light-reflective member 143 is provided at the side surface 114.

As shown in FIG. 16, the wiring 51 is provided at the lower surface of the second light-reflective member 42, the lower surface of the first light-reflective member 141, and the lower surface of the sixth light-reflective member 26. The wiring 51 is connected to the electrodes 23 of the light-emitting element 21. The wiring board 50 described above with reference to FIG. 4 is bonded to the wiring 51. As shown in FIGS. 15 and 16, the recess 16 is formed in a region of the first surface 11 of the light guide plate 10 facing the second light-reflective member 42. Or, a protrusion may be formed in the first surface 11 of the light guide plate 10. For example, the recess 16 (or the protrusion) is formed in a concentric circular configuration at the periphery of the recess 15 facing the light-emitting device 20. Or, the recess 16 (or the protrusion) may be formed in a dot configuration. The recess 16 (or the protrusion) functions as a prism that refracts and/or reflects the light.

The first light-reflective member 141, the third light-reflective member 143, the fourth light-reflective member 44, the fifth light-reflective member 45, and the sixth light-reflective member 26 are, for example, white resin members including light-diffusing materials. The first light-reflective member 141, the third light-reflective member 143, the fourth light-reflective member 44, the fifth light-reflective member 45, and the sixth light-reflective member 26 are, for example, members of a silicone resin or an epoxy resin including titanium oxide as the light-diffusing material.

The second light-reflective member 42 is configured similarly to that of the embodiment described above.

The diffuse reflectances for the light emitted by the light-emitting device 20 of the first light-reflective member 141, the third light-reflective member 143, the fourth light-reflective member 44, the fifth light-reflective member 45, and the sixth light-reflective member 26 are greater than the diffuse reflectance for the light emitted by the light-emitting device 20 of the second light-reflective member 42.

For the first light-reflective member 141, the third light-reflective member 143, the fourth light-reflective member 44, the fifth light-reflective member 45, and the sixth light-reflective member 26, the diffuse reflectances are greater than the specular reflectances for the light emitted by the light-emitting device 20. For the second light-reflective member 42, the diffuse reflectance is less than the specular reflectance for the light emitted by the light-emitting device 20.

The content ratios (weight percent) of the light-diffusing materials in the fourth light-reflective member 44 and the fifth light-reflective member 45 may be less than the content ratios (weight percent) of the light-diffusing materials in the first light-reflective member 141, the third light-reflective member 143, and the sixth light-reflective member 26. Therefore, the transmittances for the light emitted by the light-emitting device 20 of the fourth light-reflective member 44 and the fifth light-reflective member 45 are greater than the transmittances for the light emitted by the light-emitting device 20 of the first light-reflective member 141, the third light-reflective member 143, and the sixth light-reflective member 26.

The light that is emitted upward at the light-emitting device 20 is moderately diffused downward and laterally by the fourth light-reflective member 44 and the fifth light-reflective member 45 while being transmitted by the fourth light-reflective member 44 and the fifth light-reflective member 45. In other words, the fourth light-reflective member 44 and the fifth light-reflective member 45 cause the region directly above the light-emitting device 20 at the light-emitting surface (the first surface 11) of the light-emitting module 2 to be not too dark and not too bright.

The light that is emitted from the light-emitting device 20 toward the second surface 12 side can be diffusely reflected upward by the first light-reflective member 141, and the luminance of the light extracted from the first surface 11, which is the light-emitting surface, can be increased.

The first light-reflective member 141 and the sixth light-reflective member 26 can suppress the exposure to the light of the light-emitting element 21 of the base 52 of the wiring board 50 at the vicinity of the light-emitting device 20 and prevent the degradation of the base 52.

A portion of the light that is diffusely reflected by the first light-reflective member 141, the fourth light-reflective member 44, and the fifth light-reflective member 45 travels toward the second light-reflective member 42 and/or the first surface 11. The light from the light-emitting device 20 is guided through the light guide plate 10 toward the side surface 114 of the light guide plate 10 while repeating total internal reflections at the first surface 11 and specular reflections at the second light-reflective member 42 in the region between the second light-reflective member 42 and the first surface 11. A portion of the light that travels toward the first surface 11 is extracted outside the light guide plate 10 from the first surface 11.

The light can be easily guided to the end (the side surface 114) of the light guide plate 10 by using, as the second light-reflective member 42, a substance having higher specular reflection characteristics than diffuse reflection characteristics for the light emitted by the light-emitting device 20. The light is easily guided to the entire region of the light guide plate 10 even when the distance between the light-emitting device 20 and the side surface 114 of the light guide plate 10 and/or the distance between the multiple light-emitting devices 20 are long. The uneven luminance in the light-emitting surface (the first surface 11) can be reduced thereby. Also, the number of the light-emitting devices 20 disposed in the light guide plate 10 may be reduced.

The light that is guided to the side surface 114 of the light guide plate 10 can be diffusely reflected toward the first surface 11 by the third light-reflective member 143 provided at the side surface 114, and the luminance of the light extracted from the first surface 11 at the region proximate to the end of the light guide plate 10 can be increased.

In a configuration in which a surface light source that has a wider light-emitting surface is realized by arranging multiple light-emitting modules 2 to be adjacent to each other, the third light-reflective member 143 suppresses the light guided between the adjacent light-emitting modules 2. For example, the light that is guided from a light-emitting module 2 in a light-emitting state to a light-emitting module 2 in a non-light-emitting state is limited.

A method for manufacturing the light-emitting module 2 will now be described with reference to FIGS. 17 to 25.

Figure 17:
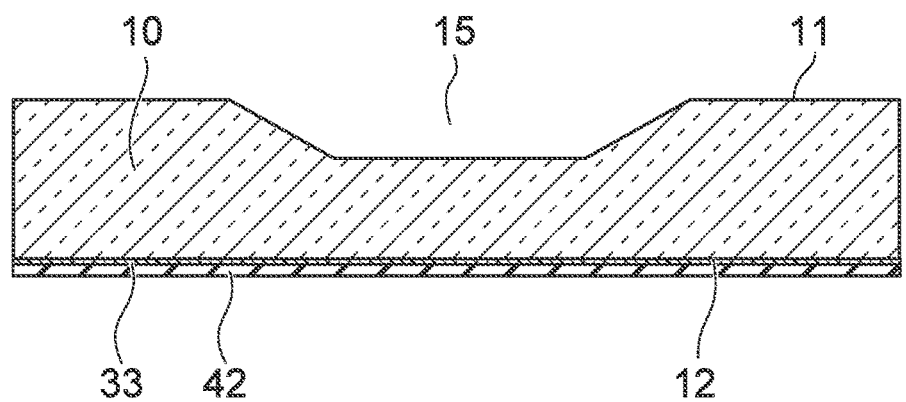
FIG. 17 to FIG. 25 are schematic cross-sectional views showing a method for manufacturing the light-emitting module shown in FIG. 15.

As shown in FIG. 17, the recess 15 is formed in the first surface 11 side of the light guide plate 10, and the second light-reflective member 42 is adhered to the second surface 12 by the bonding layer 33.

Figure 18:
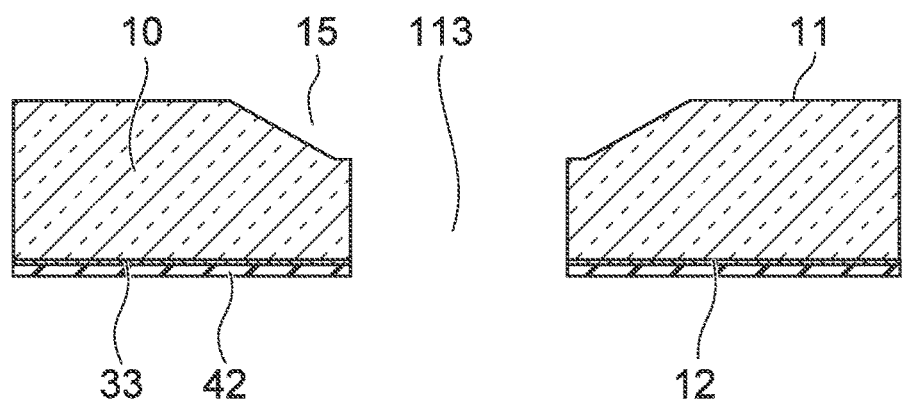

After the second light-reflective member 42 is adhered to the second surface 12, as shown in FIG. 18, the through-portion (the through-hole) 113 that extends between the first surface 11 and the second surface 12 is formed in the light guide plate 10 to extend through the second light-reflective member 42 as well.

Figure 19:
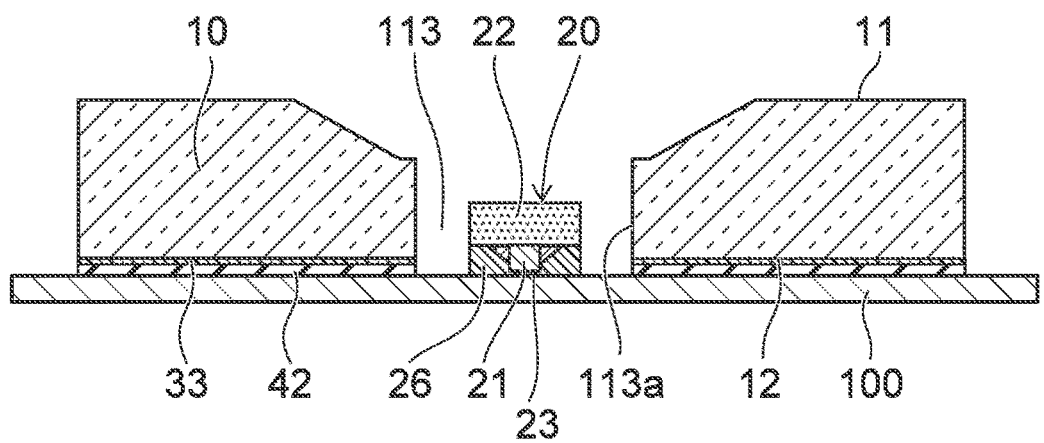

After the through-portion 113 is formed, the second surface 12 side of the light guide plate 10 is adhered to a sheet 100 as shown in FIG. 19. The surface of the second light-reflective member 42 is adhered to the sheet 100. The opening at the second surface 12 side of the through-portion 113 is sealed with the sheet 100. A portion of the sheet 100 forms the bottom surface of the through-portion 113.

Then, the light-emitting device 20 is disposed in the through-portion 113. The electrodes 23 and the sixth light-reflective member 26 of the light-emitting device 20 are adhered on the sheet 100 that seals the opening at the second surface 12 side of the through-portion 113. A gap exists between the side surface of the light-emitting device 20 and the sidewall 113a of the through-portion 113.

Figure 20:
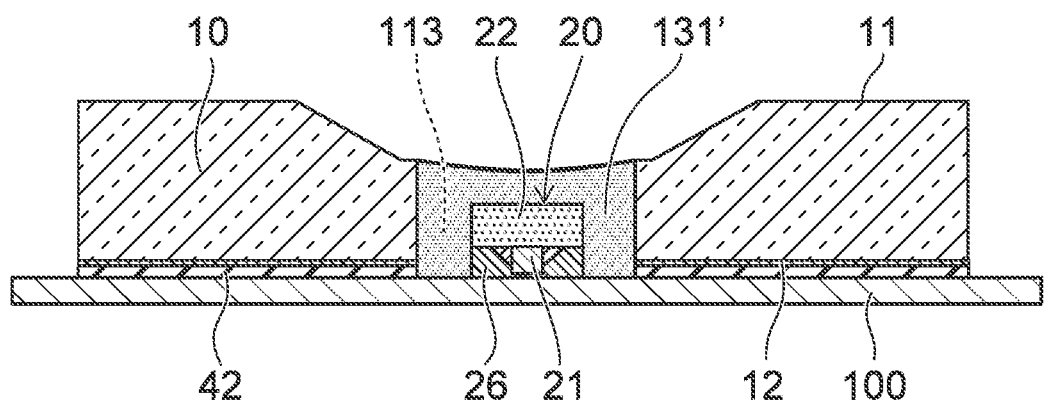

After the light-emitting device 20 is disposed in the through-portion 113, a liquid resin 131' is supplied to the through-portion 113 as shown in FIG. 20. The resin 131' includes, for example, a light-diffusing material such as titanium oxide, etc. Then, the light-diffusing material that is included in the resin 131' is caused by centrifuge to settle on the upper surface of the light-emitting device 20 and the sheet 100 that seals the opening at the second surface 12 side of the through-portion 113. The light-diffusing material that settles on the sheet 100 settles in a region that is lower than the transparent member 22.

Figure 21:
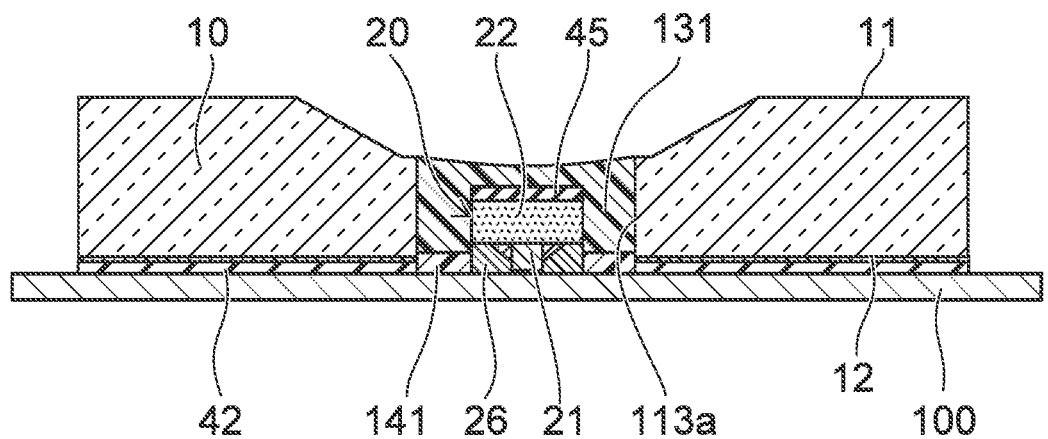

Due to the settling of the light-diffusing material, the fifth light-reflective member 45 is formed on the upper surface of the transparent member 22 of the light-emitting device 20, and the first light-reflective member 141 is formed at the periphery of the light-emitting device 20 at the second surface 12 side as shown in FIG. 21.

After the light-diffusing material settles, the resin 131' is cured. For example, the resin 131' is thermally cured at a temperature of about 150° C. The sheet 100 is heat-resistant to the temperature at this time.

By the curing of the resin 131', the light-transmissive member 131 is formed between the light-emitting device 20 and the sidewall 113a of the through-portion 113 and on the light-emitting device 20 inside the through-portion 113, and the light-emitting device 20 is fixed to the light guide plate 10 by the light-transmissive member 131.

Figure 22:
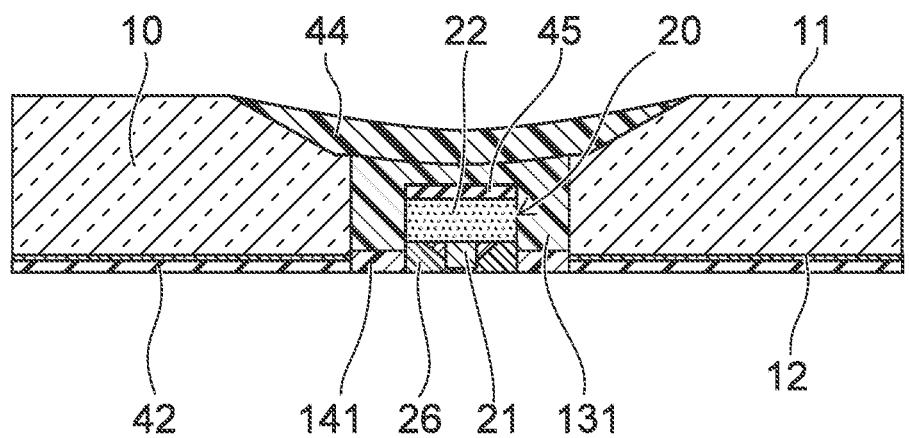

As shown in FIG. 22, the fourth light-reflective member 44 is formed in the recess 15 on the light-transmissive member 131.

Figure 23:
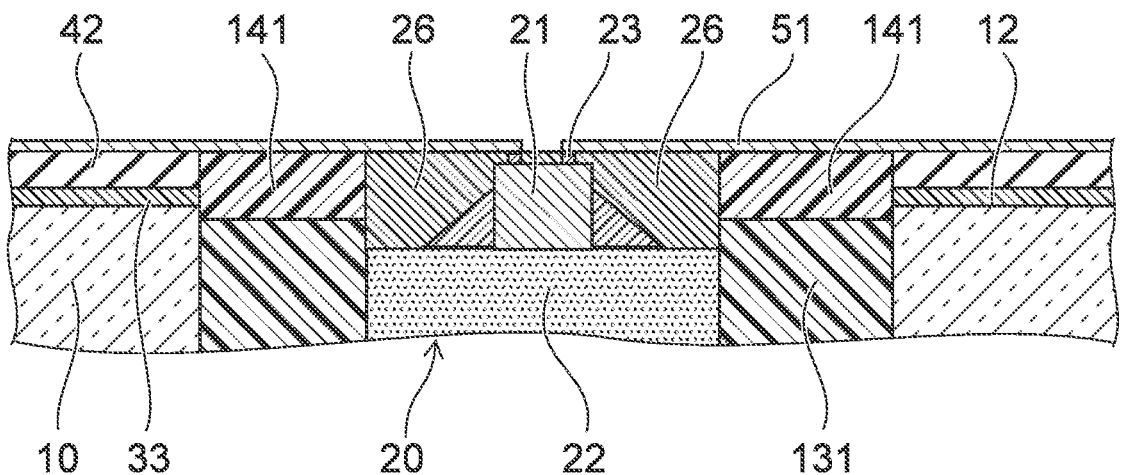

The electrodes 23 of the light-emitting device 20 are exposed at the second surface 12 side by separating the sheet 100 and the light guide plate 10 to which the light-emitting device 20 is fixed. Then, as shown in FIG. 23, the wiring 51 is formed on the second light-reflective member 42, on the first light-reflective member 141, and on the sixth light-reflective member 26 to be connected to the exposed electrodes 23.

Figure 24:
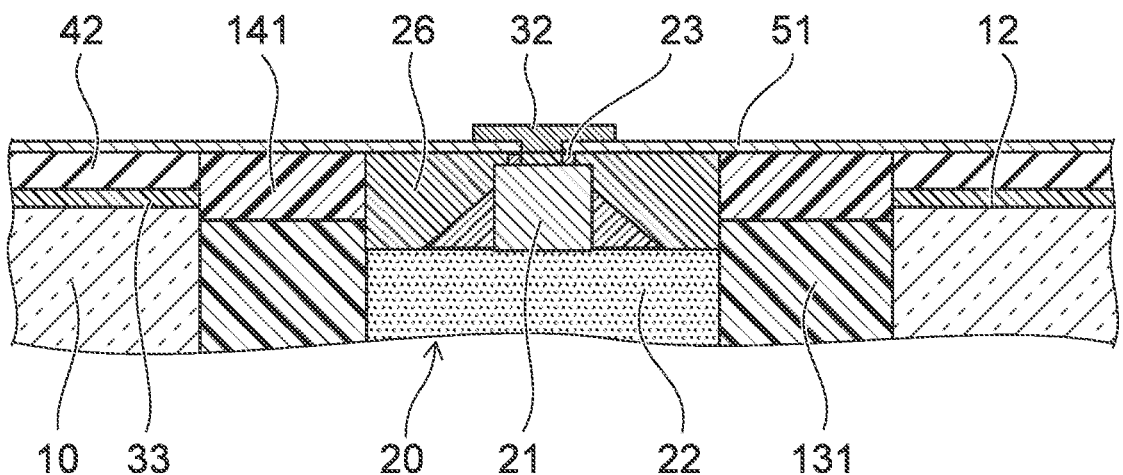

The wiring 51 is not formed on the sixth light-reflective member 26 between the pair of positive and negative electrodes 23. As shown in FIG. 24, the insulating film 32 is formed on the sixth light-reflective member 26 between the pair of electrodes 23 to increase the insulative properties between the pair of electrodes 23.

Figure 25:
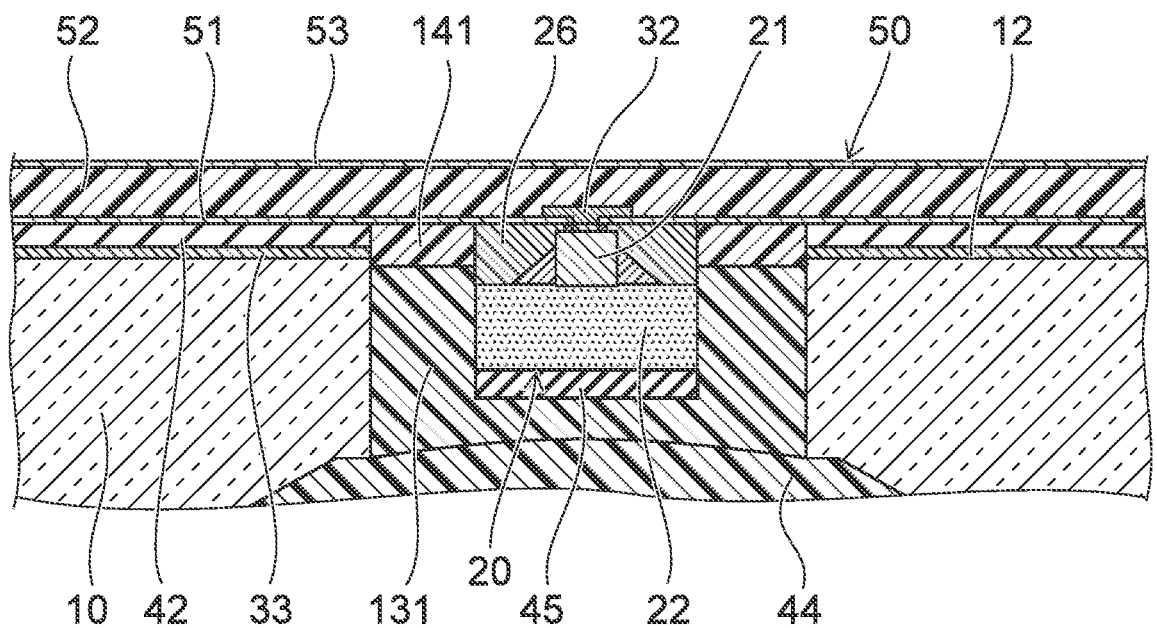

Then, as shown in FIG. 25, in the case where the light-emitting module 2 is connected to the wiring board 50, the base 52 of the wiring board 50 is adhered to the wiring 51. Subsequently, the conductive via 54 shown in FIG. 5 is formed, and the insulating film 55 that covers the conductive via 54 and the wiring 53 of the wiring board 50 is formed.

In the embodiment as well, the light-emitting devices 20 can be disposed with high positional precision with respect to the light guide plate 10 because the light guide plate 10 and the light-emitting devices 20 are configured as a continuous body and the light-emitting devices 20 are held by the light guide plate 10 and not by the wiring board 50. The unevenness of the luminance distribution in the light-emitting surface of the light guide plate 10 is suppressed thereby.

The electrodes 23 of the light-emitting device 20 are not covered with the second light-reflective member 42 because the through-portion 113 is formed after adhering the second light-reflective member 42 to the second surface 12, and the light-emitting device 20 is disposed in the through-portion 113. Also, the electrodes 23 of the light-emitting device 20 are not covered with the resin 131' because the resin 131' is supplied to the through-portion 113 after adhering the electrodes 23 of the light-emitting device 20 to the sheet 100. Then, the electrodes 23 of the light-emitting device 20 are exposed by peeling the sheet 100 after curing the resin 131'. Accordingly, processes of removing the resin 131' and/or the second light-reflective member 42 covering the electrodes 23 of the light-emitting device 20 are unnecessary, and the wiring 51 can be easily connected to the electrodes 23.

Figure 26:
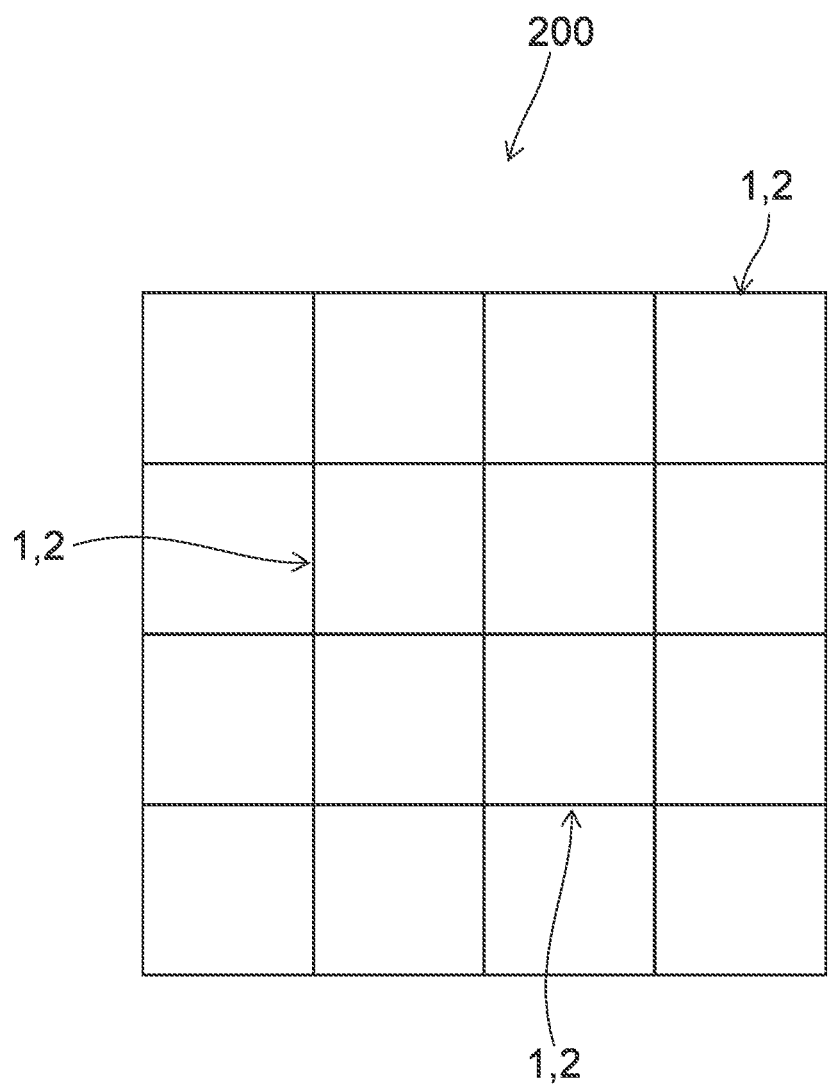
FIG. 26 is a schematic plan view of a light-emitting module of another embodiment of the present disclosure.

FIG. 26 is a schematic plan view of a light-emitting module 200 of another embodiment of the present disclosure.

The light-emitting module 200 has a configuration in which multiple light-emitting modules 1 or light-emitting modules 2 described above are arranged. For example, the third light-reflective members 43 and 143 of the light-emitting modules 1 and 2 are adjacent to each other. The third light-reflective members 43 and 143 limit the light guided between the adjacent light-emitting modules 1 and 2.

Figure 27:
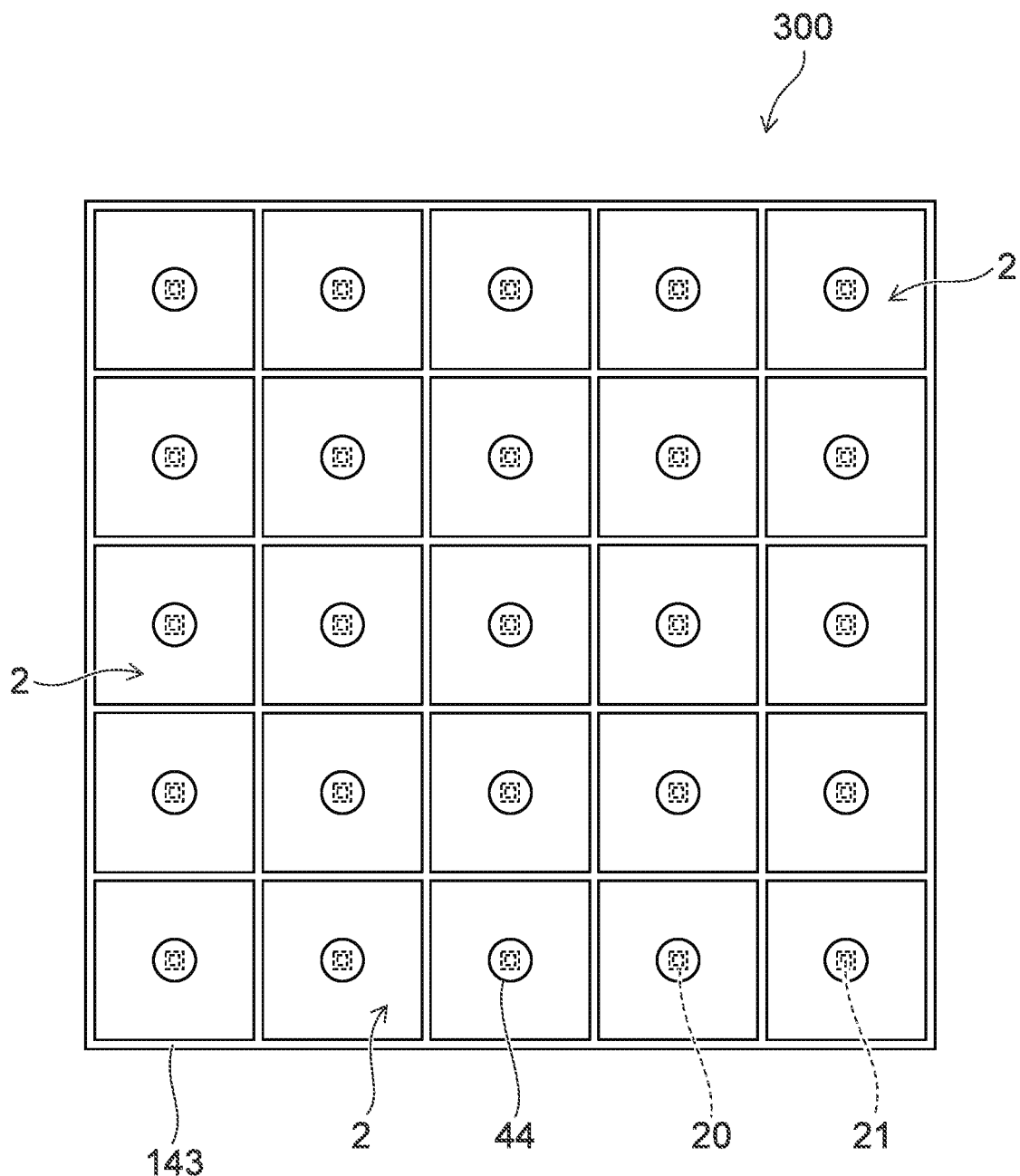
FIG. 27 is a schematic plan view of a light-emitting module of another embodiment of the present disclosure.

FIG. 27 is a schematic plan view of a light-emitting module 300 of another embodiment of the present disclosure.

The light-emitting module 300 has a configuration in which multiple light-emitting modules 2 shown in FIGS. 15 and 16 described above are arranged. The third light-reflective members 143 of the light-emitting module 2 are adjacent to each other. The third light-reflective member 143 continuously surrounds the periphery of the light-emitting module 2.

The embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A light-emitting module, comprising:
   a light guide plate including a first surface, and a second surface opposite to the first surface;
   a light-emitting device disposed at a second surface side of the light guide plate;
   a first light-reflective member provided at a periphery of the light-emitting device at the second surface side; and
   a second light-reflective member provided outward of the first light-reflective member at the second surface in a lateral direction,
   a diffuse reflectance of the first light-reflective member for light emitted by the light-emitting device being greater than a diffuse reflectance of the second light-reflective member for the light emitted by the light-emitting device.

2. The light-emitting module according to claim 1, wherein
   the diffuse reflectance of the first light-reflective member for the light emitted by the light-emitting device is greater than a specular reflectance of the first light-reflective member for the light emitted by the light-emitting device, and
   the diffuse reflectance of the second light-reflective member for the light emitted by the light-emitting device is less than a specular reflectance of the second light-reflective member for the light emitted by the light-emitting device.

3. The light-emitting module according to claim 1, wherein
   the first light-reflective member comprises a resin member and a light-diffusing material, and has a higher content ratio of the light-diffusing material than the second light-reflective member.

4. The light-emitting module according to claim 1, wherein
   the second light-reflective member does not include a light-diffusing material.

5. The light-emitting module according to claim 1, wherein
   the second light-reflective member includes a stacked film of a plurality of insulating films.

6. The light-emitting module according to claim 1, further comprising:
   a third light-reflective member provided at a side surface of the light guide plate,
   a diffuse reflectance of the third light-reflective member for the light emitted by the light-emitting device being greater than the diffuse reflectance of the second light-reflective member for the light emitted by the light-emitting device.

7. The light-emitting module according to claim 6, wherein
   the third light-reflective member comprises a resin member including a light-diffusing material.

8. The light-emitting module according to claim 1, wherein
   the light-emitting device is disposed in a recess provided at the second surface side of the light guide plate.

9. The light-emitting module according to claim 8, wherein
   the light-emitting device is fixed to the light guide plate by a light-transmissive member provided between a sidewall of the recess and a side surface of the light-emitting device.

10. The light-emitting module according to claim 8, further comprising:
    a fourth light-reflective member provided at the first surface side at a portion of the light guide plate facing the light-emitting device.

11. The light-emitting module according to claim 1, wherein
    the light-emitting device is disposed in a through-portion extending between the first surface and the second surface of the light guide plate.

12. The light-emitting module according to claim 11, wherein
    the light-emitting device is fixed to the light guide plate by a light-transmissive member provided between a sidewall of the through-portion and a side surface of the light-emitting device.

13. The light-emitting module according to claim 11, further comprising:
    a fifth light-reflective member at an upper surface of the light-emitting device.

14. The light-emitting module according to claim 12, further comprising:
    a fourth light-reflective member provided on the light-emitting device with the light-transmissive member interposed therebetween.

15. The light-emitting module according to claim 10, wherein
    the fourth light-reflective member comprises a resin member including a light-diffusing material.

16. The light-emitting module according to claim 14, wherein
    the fourth light-reflective member comprises a resin member including a light-diffusing material.

17. The light-emitting module according to claim 1, wherein
    the light-emitting device includes:
    a light-emitting element;
    a transparent member covering a major light-emitting surface of the light-emitting element; and
    a sixth light-reflective member covering a side surface of the light-emitting element.

* * * * *